United States Patent
Naji et al.

(10) Patent No.: US 6,512,689 B1
(45) Date of Patent: Jan. 28, 2003

(54) MRAM WITHOUT ISOLATION DEVICES

(75) Inventors: Peter K. Naji, Gilbert, AZ (US); Mark A. Durlam, Chandler, AZ (US); Saied N. Tehrani, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/051,646

(22) Filed: Jan. 18, 2002

(51) Int. Cl.$^7$ ............................ G11C 11/00; G11C 11/14
(52) U.S. Cl. ..................... 365/158; 365/171; 365/173
(58) Field of Search ........................... 365/158, 171, 365/173, 225.5

(56) References Cited

U.S. PATENT DOCUMENTS 6,341,084 B2 * 1/2002 Numata et al. ............. 365/158
6,359,805 B1 * 3/2002 Hidaka ...................... 365/171
6,418,046 B1 * 7/2002 Naji .......................... 365/158

* cited by examiner

Primary Examiner—Son Mai
(74) Attorney, Agent, or Firm—William E. Koch

(57) ABSTRACT

A magnetoresistive random access memory architecture free of isolation devices includes a plurality of data columns of non-volatile magnetoresistive elements. A reference column includes non-volatile magnetoresistive elements positioned adjacent to the data column. Each column is connected to a current conveyor. A selected data current conveyor and the reference current conveyor are connected to inputs of a differential amplifier for differentially comparing a data voltage to a reference voltage. The current conveyors are connected directly to the ends of the data and reference bitlines. This specific arrangement allows the current conveyors to be clamped to the same voltage which reduces or removes sneak circuits to substantially reduce leakage currents.

17 Claims, 6 Drawing Sheets

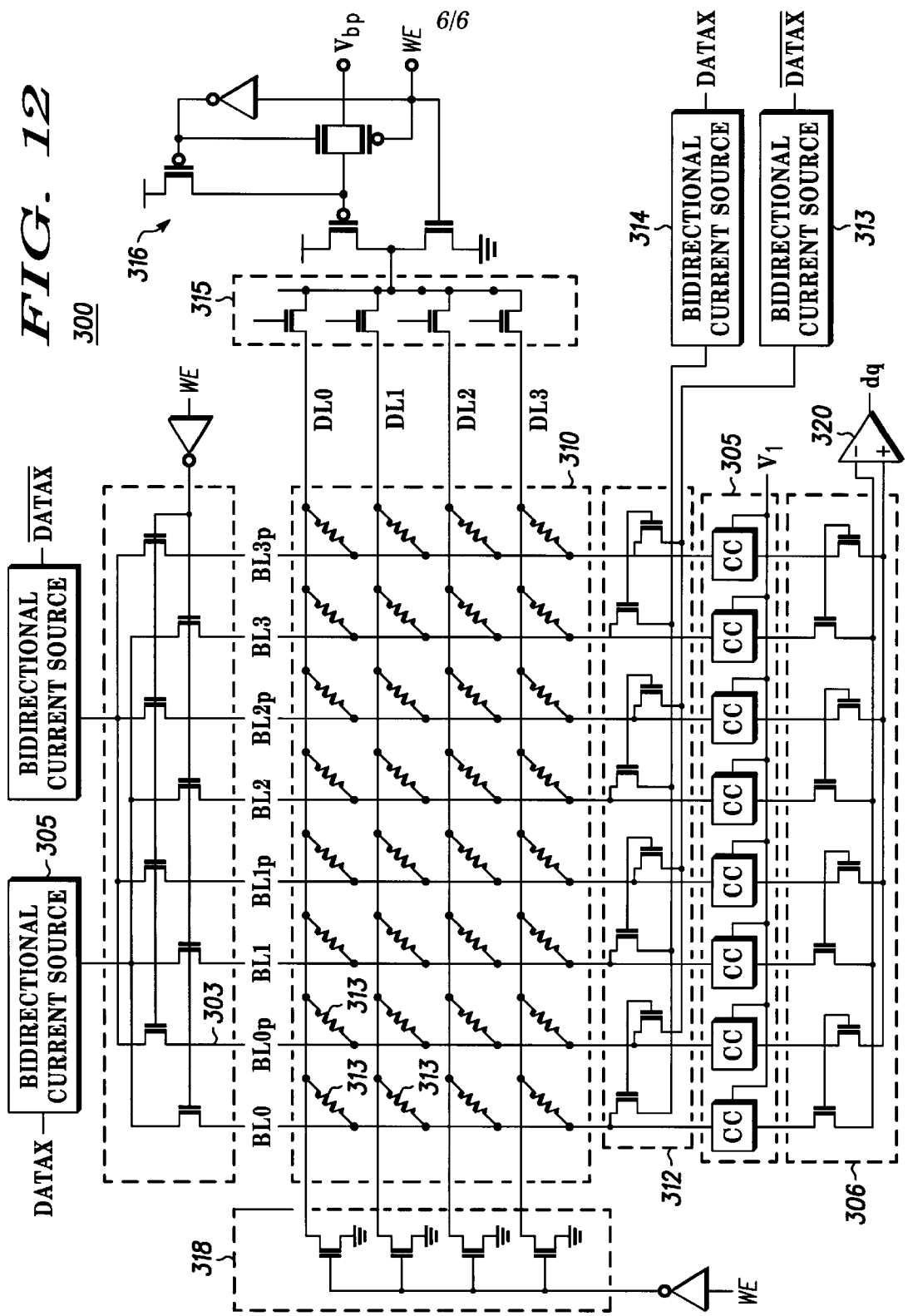

MRAM WITHOUT ISOLATION DEVICES

FIELD OF THE INVENTION

This invention relates to magnetoresistive memories and more particularly, to MRAM array architecture designed so that isolation devices are not required.

BACKGROUND OF THE INVENTION

Thin film Magnetoresistive Random Access Memories (MRAMs) can be fabricated in a variety of memory cell embodiments, including a Magnetic Tunneling Junction (MTJ) cell. Since the MTJ cell is the easiest to manufacture and use, it will be used as the primary example throughout this disclosure, with the understanding that the various concepts also apply to other MRAM cells and arrays. The MTJ cell essentially consists of a pair of magnetic layers with an insulating layer sandwiched therebetween. One of the magnetic layers has a fixed magnetic vector and the other magnetic layer has a changeable magnetic vector that is either aligned with or opposed to the fixed magnetic vector. When the magnetic vectors are aligned the resistance of the MTJ cell, i.e. the resistance to current flow between the magnetic layers, is a minimum and when the magnetic vectors are opposed or misaligned the resistance of the MTJ cell is a maximum.

Data is stored in the MTJ cell by applying a magnetic field to the MTJ cell directed so as to move the changeable magnetic vector to a selected orientation. Generally, the aligned orientation can be designated a logic 1 or 0 and the misaligned orientation is the opposite, i.e., a logic 0 or 1. Stored data is read or sensed by passing a current through the MTJ cell from one magnetic layer to the other. The amount of current passing through the MTJ cell, or the voltage drop across the MTJ cell, will vary according to the orientation of the changeable magnetic vector. Additional information as to the fabrication and operation of MTJ memory cells can be found in U.S. Pat. No. 5,702,831, entitled "Multi-Layer Magnetic Tunneling Junction Memory Cells", issued Mar. 11, 1998, and incorporated herein by reference.

In most prior art circuits, an isolation device, generally a transistor in series or in parallel with each magnetoresistive device in a memory array, is included to avoid leakage paths throughout the memory array. In most instances the magnetoresistive device and the isolation device are fabricated as a single unit. For example, an isolation transistor is usually fabricated on a semiconductor substrate and the associated magnetoresistive device is fabricated on the isolation transistor so as to be connected internally. One of the problems in this structure is the amount of manufacturing effort required to produce the combined isolation transistor and magnetoresistive device and the control lines required for operation. Also, the large number of isolation devices and control lines for the isolation devices substantially increases the size of the memory array.

In one prior art memory array, magnetoresistive devices without isolation devices are connected so that one input of a differential amplifier is connected to a target column containing the Magnetoresistive device being read, with the other input connected to ground. Feedback within the differential amplifier clamps the target column to a ground potential. All other columns in the array are grounded (i.e. the bitlines are clamped to ground) by means of column select transistors. The read process is performed by applying a read voltage to the row containing the Magnetoresistive device to be read and to all other magnetoresistive devices in the row. Supposedly, since all columns in the array are at ground potential, no current flows between the magnetoresistive device not being read on deselected rows. A major problem with this architecture is that it fails to equalize target (column being read) and other columns adequately, due to non-idealization of clamp circuits, resulting in sneak paths which yield signal loss and speed degradation.

In another prior art memory array, a target column and an associated reference column are connected through a sense amplifier to an output terminal. The sense amplifier sources bitline current through the target column and the references column and clamps the two columns to the same potential. Changes in the current in the target cell (in the target column) are compared with current through the reference cells (in the reference column). However, it is not clear how the two currents differ when both target and reference magnetoresistance cells are in the same state. Also, due to differences in the paths, target and reference columns will not clamp to exactly the same voltage, resulting in sneak paths.

Accordingly it is highly desirable to provide magnetoresistive memory arrays that do not include isolation devices and which overcome the above described problems.

BRIEF DESCRIPTION OF THE DRAWINGS

Referring to the drawings:

FIG. 12 is a simplified schematic diagram of another complete memory architecture incorporating an isolation free magnetoresistive memory array in accordance with the present invention.

DESCRIPTION OF THE PREFERRED EMBODIMENTS

Figure 1:
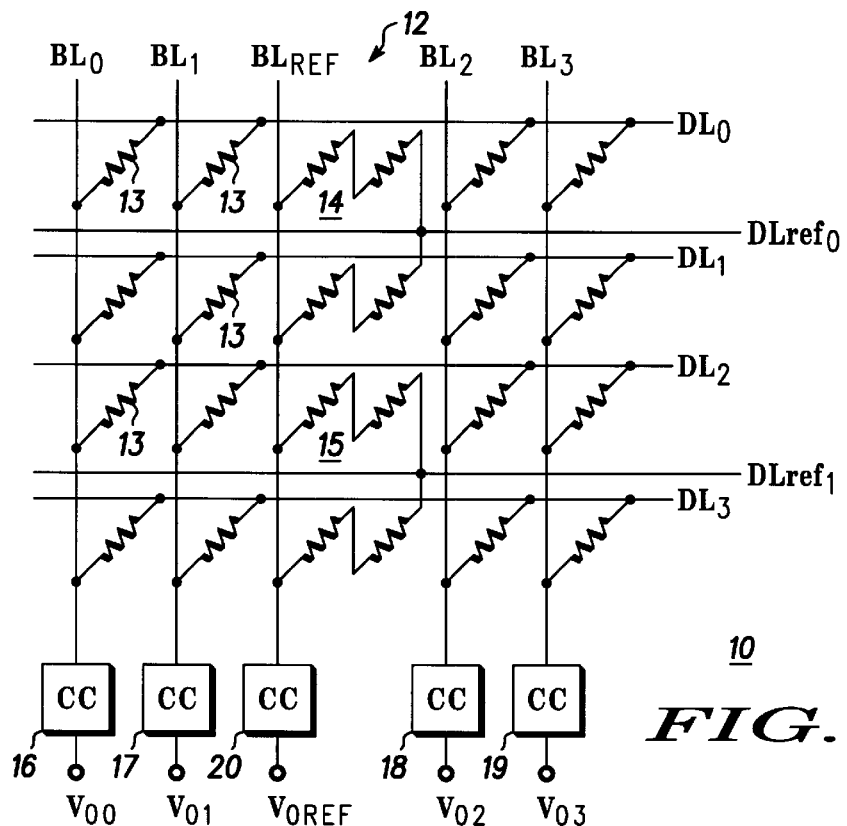
FIG. 1 is a simplified schematic diagram illustrating an isolation free magnetoresistive memory array with an interspersed reference column in accordance with the present invention.

Turning now to FIG. 1, a simplified schematic diagram is illustrated of an isolation free magnetoresistive memory array 10 with an interspersed reference column 12 in accordance with the present invention. In this example, array 10 is a 4×4 array and reference column 12 includes two midpoint generators 14 and 15 with each generator 14 and 15 taking up two rows of magnetoresistive elements. Here it should be specifically noted that a plurality of non-volatile magnetoresistive elements (each designated 13), each programmable to one of an Rmax and an Rmin state, are connected to have information stored therein. The non-volatile magnetoresistive elements 13 in a data column (e.g. column $BL_0$) are each directly connected, without incorporating isolation devices, at one end to the column bitline $BL_0$ and at the other end to a digitline of a plurality of digit lines $DL_0$ through $DL_3$. Each bitline, $BL_0$ through $BL_3$ and BLref, is connected to output terminals $Vo_0$ through $Vo_3$ and Voref, respectively, through current conveyor circuits 16 through 20.

Figure 2:
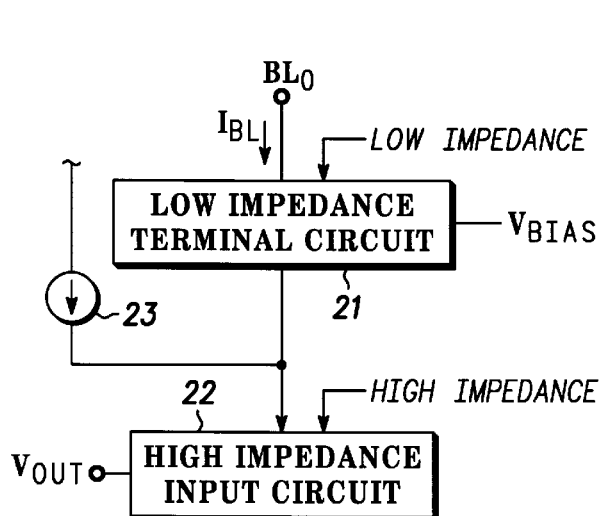
FIG. 2 is a simplified block diagram of an embodiment of a readout portion of the array of FIG. 1.

Referring additionally to FIG. 2, a simplified block diagram is illustrated of an embodiment of current conveyor circuit 16 as used in the readout portion of array 10 of FIG. 1. Since each of the current conveyor circuits 16 through 20 is similar, only circuit 16 will be described in detail. Here it should be understood that the block diagram of circuit 16 is illustrated primarily to describe the construction and operation of the current conveyors in conjunction with an array, such as array 10. Also, it should be noted that any one, or all, of the current conveyors 16 through 20, or any other current conveyors described or referred to below, may constitute a current sensor, current amplifier, preamplifier, current source, clamp circuit current to voltage converter, etc. or any combination of the above that performs the intended and described purpose, and will be hereinafter referred to simply as a "current conveyor" or "current conveyor circuit".

In this exemplary embodiment, current conveyor 16 includes a low impedance terminal circuit 21 having a terminal connected to bitline $BL_0$ to receive $I_{BL}$ bitline current. A $V_{BIAS}$ signal is also applied to circuit 21 to provide a clamping reference. A second terminal of circuit 21 takes a portion of the current from a current source 23 applied to an input of a high impedance input circuit 22. Circuit 21 conveys a portion of the current from current source 23 from one terminal to the other. Circuit 22 converts the current to an output voltage $V_{o0}$. Generally, circuit 21 can include a clamp circuit, a current sensor, a current sense amplifier, a pre-amplifier or the like. Circuit 22 can include a converter, an amplifier, a second sense amplifier, or the like and is generally included to essentially provide current mode operation. Current conveyor 16 has a very low input impedance, isolating bitline $BL_0$ from the high output impedance of current source 23. The low input impedance combined with the clamping of $BL_0$ limits the voltage swing of bitline $BL_0$ and achieves high speed readout for very high density MTJ arrays. Thus, current conveyor 16 provides and maintains a constant bias across bitline $BL_0$ regardless of operating temperatures, changes in the supply voltage, and process conditions. Also, current conveyor 16 provides a small swing in the voltage on bitline $BL_0$ to allow for high speed operation.

In this example circuit 20 includes a similar pair of current conveyor connected to bitline BLref, which serves as a reference column in array 10. The data voltage generated from data stored in the memory cells associated with bitline $BL_0$ is compared in a differential amplifier to the reference voltage generated from midpoint generators 14 or 15 associated with bitline BLref to provide a data output signal. Additional information on the operation, construction, and different embodiments of current conveyors is available in U.S. Pat. No. 6,205,073, entitled "current conveyor and Method for Readout of MTJ Memories", incorporated herein by reference.

Figure 3:
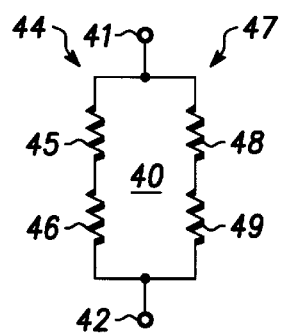
FIGS. 3 and 4 are simplified schematic diagrams illustrating the operation of a midpoint generator used in the array of FIG. 1.

The operation of either midpoint generator 14 or 15 is best understood by referring to FIG. 3, which illustrates a simplified schematic diagram showing the operation of a midpoint generator 40. A midpoint resistance midway, or half way, between Rmin and Rmax is designated Rmid. The following equation describes the relationship of Rmid to Rmin and Rmax:

$$R\text{mid}=(R\text{max}-R\text{min})/2+R\text{min}$$

$$R\text{mid}=\Delta R/2+R\text{min} \quad (1)$$

where $\Delta R = R\text{max} - R\text{min}$

Equation (1) is implemented by a series/parallel combination of magnetoresistive elements as illustrated in FIG. 3. Magnetoresistive elements can be combined in this manner because they are linear elements to the first order and, therefore, they can be treated as ordinary passive linear resistors. In this simplified example, midpoint generator 40 includes an input terminal 41 and an output terminal 42. A series circuit 44 includes a magnetoresistive element 45, with a resistance equal to Rmax, connected in series with a magnetoresistive element 46, with a resistance equal to Rmin, connected in series between input terminal 41 and output terminal 42. Another series circuit 47 includes a magnetoresistive element 48, with a resistance equal to Rmax, connected in series with a magnetoresistive element 49, with a resistance equal to Rmin, connected in series between input terminal 41 and output terminal 42. Series circuit 44 is also connected in parallel with series circuit 47 to form the series/parallel combination.

The series/parallel combination of resistances of generator 40 are combined as follows:

$$R\text{mid}=(R\text{max}+R\text{min})\|(R\text{max}+R\text{min})=R_{AB}$$

where $R_{AB}$ is the total resistance between input terminal 41 and output terminal 42.

$$\begin{aligned} R_{AB} &= (R\text{max}+R\text{min})^2/2 \, (R\text{max}+R\text{min}) \\ &= (R\text{max}+R\text{min})/2 \\ &= (\Delta R+R\text{min}+R\text{min})/2 \\ R_{AB} &= \Delta R/2 + R\text{min} \quad (2) \end{aligned}$$

It can be seen that equation (2) is equal to equation (1), i.e. $R_{AB}$ is equal to Rmid, and generator 40 successfully generates the midpoint Rmid.

In general, magnetoresistive elements are non-volatile memory elements which can be programmed into an Rmax or an Rmin state, where Rmin is a minimum resistive value corresponding to parallel states of magnetization and Rmax is a maximum resistive value corresponding to anti-parallel states of magnetization. Further, magnetoresistive elements are generally initially in the Rmin state and must be programmed into the Rmax state prior to the generation of Rmid. This programming can be done as a one time effort and, thereafter, Rmax is generated automatically without any need to reprogram, since the magnetoresistive elements hold their magnetization state in a non volatile fashion.

Figure 4:
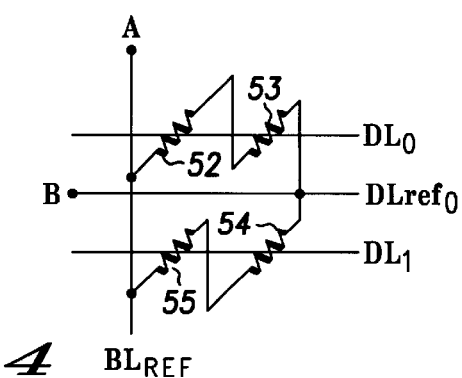

Referring additionally to FIG. 4, a schematic diagram is illustrated, for example only, of midpoint generator 14, to show current flow during a readout operation. First, it should be noted that every two digit lines have an associated digit reference line (e.g. $DL_0$ and $DL_1$ are associated with $DL_{ref}$). Further, if either of the two digit lines is selected (e.g. either $DL_0$ and $DL_1$), the associated digit reference line (i.e. $DL_{ref}$) will be selected also. In the read mode, a selected digit line is grounded along with its associated digit reference line. In the example illustrated in FIG. 4, digit reference line $DL_{ref0}$ is grounded. Midpoint generator 14 includes magnetoresistive elements 52 through 55. Magnetoresistive elements 52 and 55 are programmed to their Rmax states. Thus it can be seen that midpoint generator 14 is basically the same as the structure of FIG. 3 with bitline $BL_{ref}$ acting as one output terminal and digitline $DL_{ref}$ acting as the other output terminal with the resistance between the output terminals being the midpoint Rmid.

Thus, a new architecture for a magnetoresistive memory array free of isolation devices is illustrated in FIG. 1. In isolation free magnetoresistive memory array 10, current conveyors 16 through 20 source current through bitlines $BL_0$ through $BL_1$ and $BL_{ref}$, respectively. Also, since all current conveyors 16 through 20 are identical and since all columns, including the reference columns, are identical, current conveyors 16 through 20 clamp bitlines $BL_0$ through $BL_1$, and $BL_{ref}$ to identical voltages. The clamping voltages of all columns or bitlines are identical (or very close), thereby minimizing column-to-column leakage.

Isolation free magnetoresistive memory array 10 would not operate as described without midpoint generators 14 and 15, since to be able to distinguish between Rmin and Rmax the reference column would have to be clamped to a different voltage or an offset current would have to be injected into the reference column to place the reference column current at a midpoint between target column currents Imax or Imin. Once all bitlines are clamped, current will flow through all columns and ultimately through a selected digitline and reference digitline, via magnetoresistive elements which connect all columns to the selected digitline and its corresponding reference digitline, to ground. Current conveyors 16 through 20 convert the information carrying currents to a voltage $V_0$ and differential amplifiers (see the explanation of FIG. 1) compare the $V_0$ to $V_{ref}$.

Figure 5:
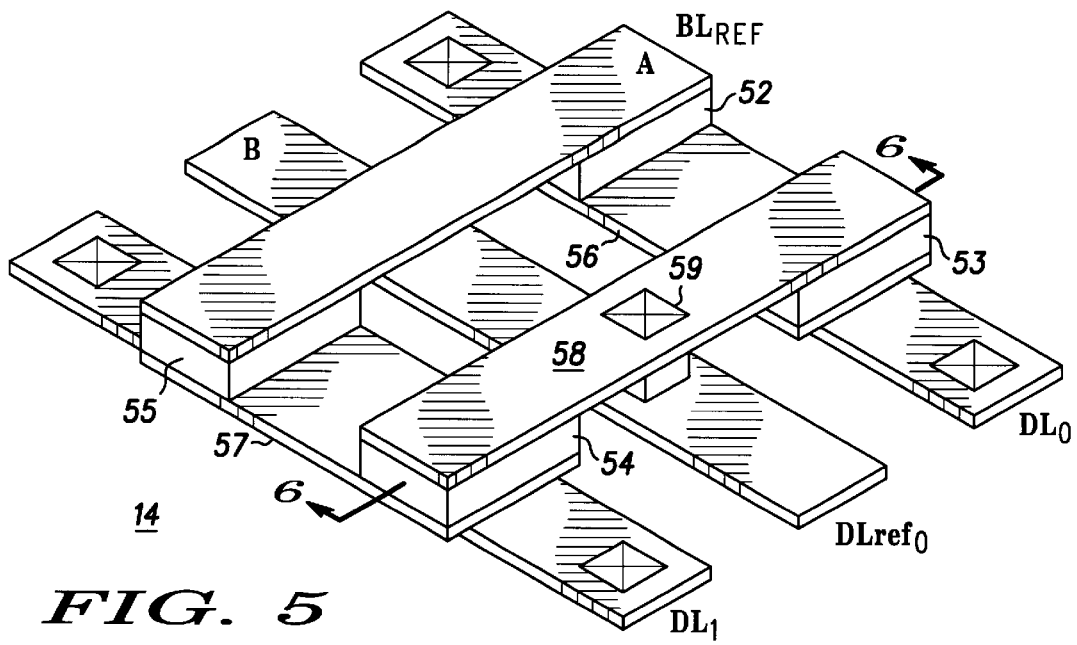
FIG. 5 is an isometric view of an embodiment of the midpoint generator of FIG. 4.
Figure 6:
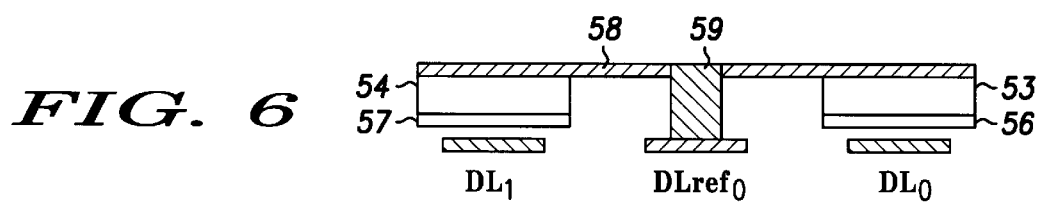
FIG. 6 is a sectional view as seen from the line 6—6 of FIG. 5.

Referring additionally to FIGS. 5 and 6, isometric and sectional views, respectively, are illustrated of an embodiment of midpoint generator 14 of FIG. 4. From these views an artisan can see that four of the regularly formed magnetoresistive elements in array 10 are easily incorporated into the midpoint generators 14 and 15. Typically, the digitlines are deposited in a first layer of material. At this time reference digitlines $DL_{ref0}$ through $DL_{refn}$ are formed between alternate pairs of data digitlines (e.g. $DL_0$–$DL_1$, $DL_2$–$DL_3$ etc.).

Magnetoresistive elements are then formed at regular intervals on each of the data digitlines (see for example FIG. 1). In this embodiment, magnetoresistive elements 52 and 53 are not formed on digitline $DL_0$ but are connected together by a short line 56 positioned slightly above digitline $D_{L0}$. Also, magnetoresistive elements 54 and 55 are not formed on digitline $DL_1$ but are connected together by a short line 57 positioned slightly above digitline $DL_1$.

The bitlines are then deposited in another layer of material so as to connect to the upper surfaces of the magnetoresistive elements. For example, as can be seen in FIGS. 5 and 6, $BL_{ref}$ is deposited so as to connect to the upper surfaces of magnetoresistive elements 52 and 55. In this embodiment, a bitline that would normally be connected to the upper surfaces of magnetoresistive elements 53 and 54 is divided into short sections, e.g. section 58, so as to only connect the second pair of magnetoresistive elements in each of the midpoint generators 14 and 15. Also, a via 59 is provided to connect section 58 to reference digitline $DL_{ref0}$. Thus, with only a few minor variations in the normal procedure for fabricating an array of magnetoresistive elements, midpoint generators can be easily incorporated.

Figure 7:
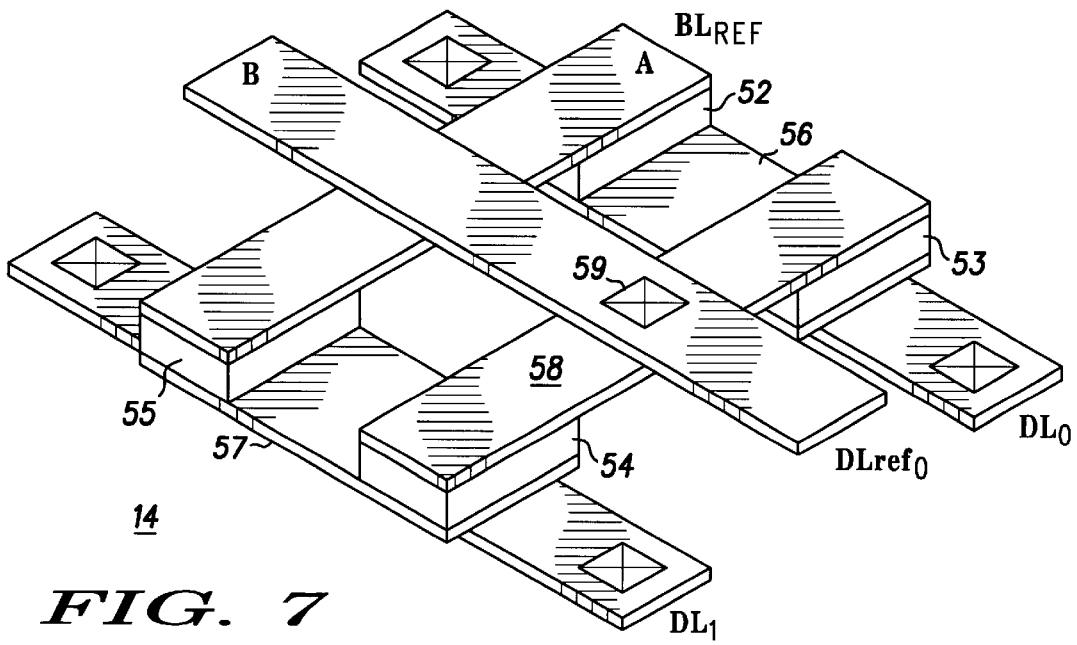
FIG. 7 is an isometric view of another embodiment of the midpoint generator of FIG. 4.

Referring additionally to FIG. 7, an isometric view of a slightly different embodiment of midpoint generator 14 is illustrated. In this embodiment, all of the components are constructed as described above, except that reference digitline $DL_{ref0}$ is formed above the magnetoresistive elements after the bitlines are formed and then connected to section 58 by via 59, yielding smaller cell size. The choice of the position of digitline $DL_{ref0}$ is generally determined by the steps of the fabrication process.

Figure 8:
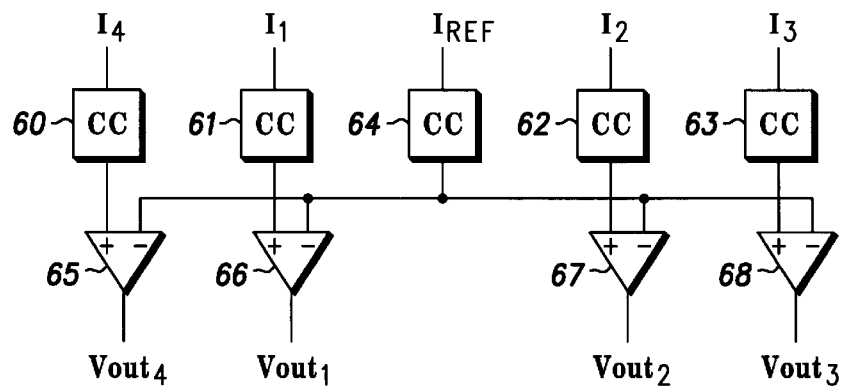
FIG. 8 is a simplified schematic diagram illustrating a different embodiment for an output circuit for use with, for example, the memory architecture of FIG. 1.

Turning now to FIG. 8, a simplified schematic diagram is illustrated showing a different embodiment of an output circuit for use with, for example, the memory architecture of FIG. 1. In this embodiment a different current conveyor circuit 60 through 64 is connected to receive each of the currents $I_o$ through $I_3$ and $I_{ref}$, respectively. Also, four differential amplifiers, 65 through 68 are each connected to receive an output from one of the current conveyor circuits 60 through 63 at one input and an output from current conveyor circuit 64 on the other input. Thus, a plurality of data columns of non-volatile magnetoresistive elements are positioned adjacent a reference column for differentially comparing a data voltage generated by a selected current conveyor and an associated data column to a reference voltage generated by the reference current conveyor and the reference column (in this embodiment an associated midpoint generator in the reference column). As will become apparent presently, a variety of other output connections can be made to one or more current conveyors and associated data columns with one or more current conveyors and associated reference columns in an optimum configuration for a specific application.

Figure 9:
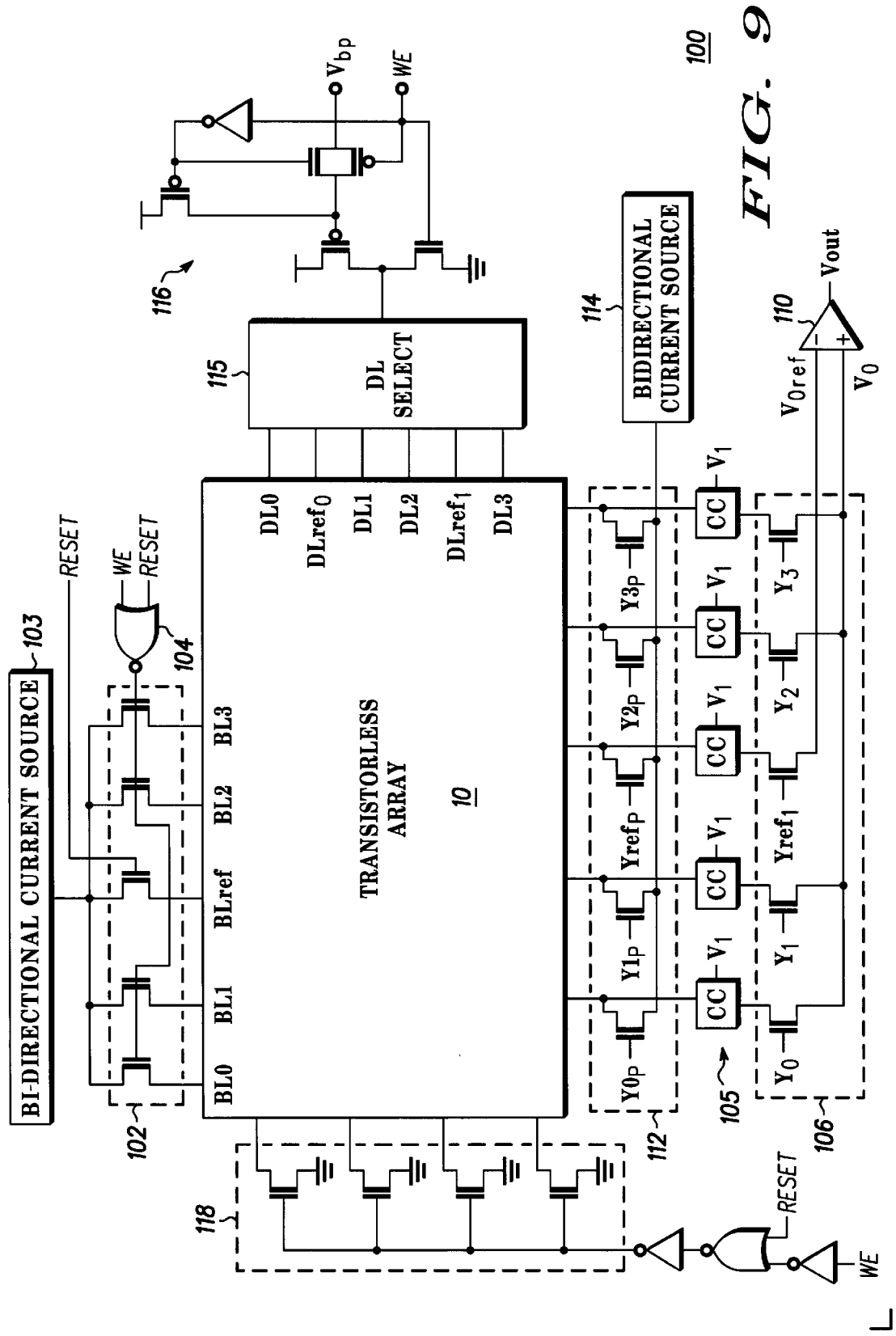
FIG. 9 is a simplified schematic diagram of a complete memory architecture incorporating the isolation free magnetoresistive memory array of FIG. 1.

Turning now to FIG. 9, a simplified schematic diagram is illustrated of a complete memory architecture, generally designated 100, incorporating, for example, the isolation free magnetoresistive memory array 10 of FIG. 1. In architecture 100, the upper ends of bitlines $BL_0$ through $BL_3$ and $BL_{ref}$ are connected through a column mode-select transistor circuit 102 (one transistor per bitline) to a bi-directional current source/sink 103. A reset signal is applied directly to the transistor connected to $BL_{ref}$ and all of the remaining transistors in circuit 102 are connected to receive a signal from an OR circuit 104. OR circuit 104 receives the reset signal on one input and a read or program WE signal on the other input. In this embodiment, when WE is a logic zero the circuit is in the program mode of operation and when WE is a logic one the circuit is in the read mode of operation.

The opposite ends of bitlines $BL_0$ through $BL_3$ and $BL_{ref}$ are connected through a bank of current conveyors 105 to a column select transistor circuit 106. All of the current conveyors in bank 105 have a common bias voltage $V_1$ applied thereto, which clamps all of the bitlines to the same voltage. Circuit 106 connects a selected current conveyor in bank 105 and the associated data bitline $BL_0$ through $BL_3$ to one input of a differential amplifier 110 and the reference output of bitline $BL_{ref}$ to the other input of differential amplifier 110. While a differential amplifier 110 is used here for simplicity, it will be understood that virtually any circuitry capable of comparing some characteristic of a pair of signals to provide the disclosed function can be utilized and the term "differential amplifier" is intended to encompass all such circuits. The opposite ends of bitlines $BL_0$ through $BL_3$ and $BL_{ref}$ are also connected through a bank of program select transistors 112 to a bi-directional current source/sink 114. Each of the program select transistors in bank 112 is activated by a separate signal $Y_{0p}$ through $Y_{3p}$ and $Y_{refp}$, respectively.

Figure 10:
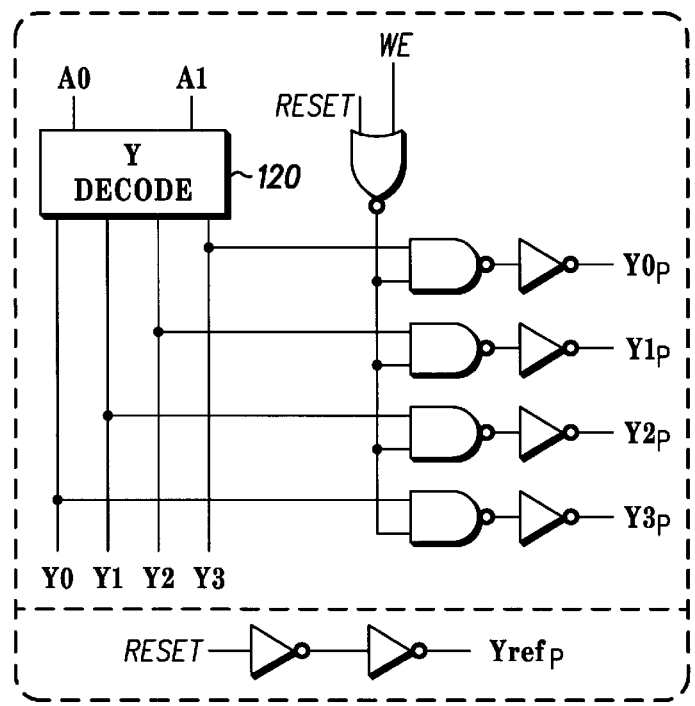
FIG. 10 is a schematic diagram illustrating additional details of control circuitry in FIG. 9.

Referring additionally to FIG. 10, a schematic diagram is illustrated showing details of control circuitry used in FIG.

9. A column decode circuit 120 is connected to receive a pair of multiplexing signals (herein designated $A_0$ and $A_1$) which are then decoded by circuit 120 into one of column select signals $Y_0$ through $Y_3$ to operate the transistors in column select transistor circuit 106, one at a time, during the read mode (WE=1, reset 0). During the programming mode (WE=0, reset 0), column decode circuit 120 produces signals $Y_{0p}$ through $Y_{3p}$, which activate a single transistor at a time in bank 112. Also, as illustrated in FIG. 10, the reset signal is supplied through timing circuits directly as a $Y_{refp}$ signal.

A reset=1 signal, which is applied to the reference transistor in column mode select transistor circuit 102 and to $Y_{refp}$ in bank 112, will allow current flow only through bitline $BL_{ref}$ between bi-directional current source/sinks 103 and 114. As a result of the current flow in bitline $BL_{ref}$ intended magnetoresistive elements in midpoint generators (e.g. elements 52 and 55 in midpoint generator 14) will be forced to an $R_{max}$ state.

During the programming mode, a bitline is selected by activating one of the transistors in bank 112, which connects the selected bitline between bi-directional current source/sinks 103 and 114. Here it should be noted again that the magnetoresistive elements in the reference column (midpoint generator in this embodiment) are only programmed once during reset and, because they are non-volatile magnetoresistive devices such as magnetic tunnel junctions, do not need to be programmed again. Thus, the bitline $BL_{ref}$ is not connected between bi-directional current source/sinks 103 and 114 by column mode-select transistor circuit 102 or bank 112 during the programming mode.

As depicted in FIG. 9, the right-hand end of digitlines $DL_0$ through $DL_3$, $DL_{ref0}$ and $DL_{ref1}$ are connected through a digitline select circuit 115 to a driver circuit 116. Driver circuit 116 supplies read voltage through array 10 during the read mode and programming current during the program mode. The opposite ends (left-hand ends) of digitlines $DL_0$ through $DL_3$ are connected through a bank of transistors 118 to ground during the programming mode and are disconnected during the read mode. Thus, programming current flows through digitlines $DL_0$ through $DL_3$, between driver 116 and ground. During the read mode, read current flows through a selected data magnetoresistive element 13 (see FIG. 1) and an associated reference midpoint generator 14 or 15, between driver 116 and current conveyors in bank 105.

Here it should be specifically noted that current conveyors in current conveyor bank 105 are connected directly to the ends of bitlines $BL_0$ through $BL_3$ and $BL_{ref}$ and the column select transistors in column select transistor circuit 106 connect the outputs of the current conveyors to differential amplifier 110. This specific arrangement allows the current conveyors to be clamped to the same voltage which reduces or removes sneak circuits to substantially reduce leakage currents.

Figure 11:
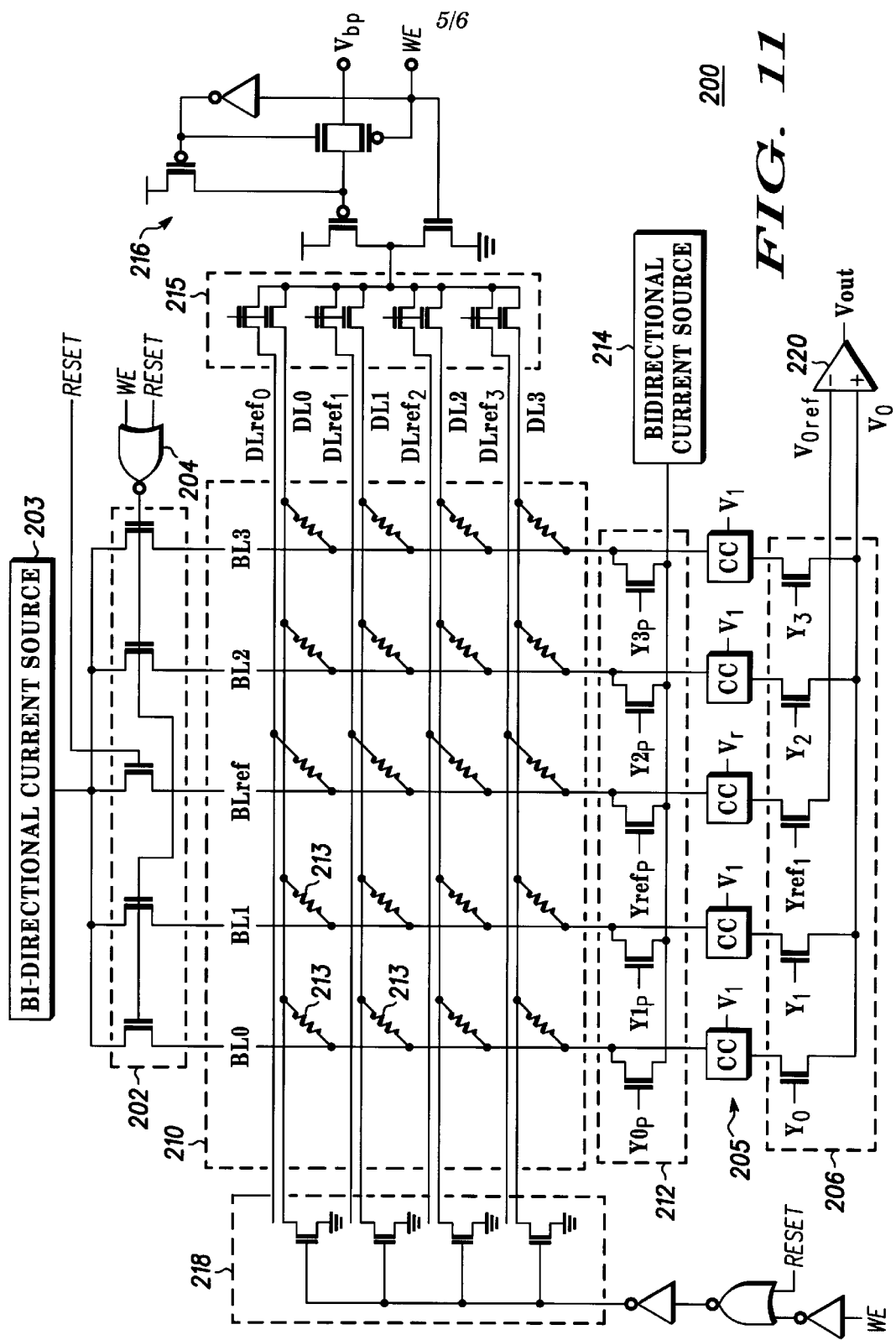
FIG. 11 is a simplified schematic diagram of another complete memory architecture incorporating an isolation free magnetoresistive memory array in accordance with the present invention.

Turning now to FIG. 11, a simplified schematic diagram is illustrated of another complete memory architecture 200 incorporating an isolation free magnetoresistive memory array 210 in accordance with the present invention. In this example, array 210 is a 4×4 array and includes a reference column 212. Here it should be specifically noted that a plurality of non-volatile magnetoresistive elements (each designated 213), each programmable to one of an Rmax and an Rmin state, are connected to have information stored therein. The non-volatile magnetoresistive elements 213 in a data column are each directly connected, without incorporating isolation devices, at one end to one of the column bitlines $BL_0$ through $BL_3$ and at the other end to one digitline of a plurality of digit lines $DL_0$ through $DL_3$. Reference column 212 includes four magnetoresistive elements 213 which are connected, one each, at one end to one reference digitline $DL_{ref0}$ through $DL_{ref3}$ and at the other end to BLref.

The upper ends of bitlines $BL_0$ through $BL_3$ and $BL_{ref}$ are connected through a column mode-select transistor circuit 202 to a bi-directional current source/sink 203. As described in conjunction with the embodiment of FIG. 9, a reset signal is applied directly to the transistor connected to $BL_{ref}$ and all of the remaining transistors in circuit 202 are connected to receive a signal from an OR circuit 204. OR circuit 204 receives the reset signal on one input and a read or program WE signal on the other input. In this embodiment, when WE is a logic zero the circuit is in the program mode of operation and when WE is a logic one the circuit is in the read mode of operation. The opposite ends of bitlines $BL_0$ through $BL_3$ and $BL_{ref}$ are connected through a bank of current conveyors 205 to a column select transistor circuit 206. The transistors in circuit 206 connect a selected current conveyor and the associated data bitline $BL_0$ through $BL_3$ to one input of a differential amplifier 220 and the reference output of the reference current conveyor and the associated bitline $BL_{ref}$ to the other input of differential amplifier 220.

A bank of program select transistors 212 are connected between bitlines $BL_0$ through $BL_3$ and $BL_{ref}$ and a bi-directional current source/sink 214. During the programming mode, a bitline is selected by activating one of the transistors in bank 212, which connects the selected bitline between bi-directional current source/sinks 203 and 214. Here it should be noted again that the magnetoresistive elements in the reference column (midpoint generator in this embodiment) are only programmed once during reset and, because they are non-volatile magnetoresistive devices such as magnetic tunnel junctions, do not need to be programmed again. Thus, the bitline $BL_{ref}$ is not connected through a transistor in column mode-select transistor circuit 202 during the programming mode.

As depicted in FIG. 11, the right-hand end of digitlines $DL_0$ through $DL_3$, $DL_{ref0}$ and $DL_{ref1}$ are connected through a digitline select circuit 215 to a driver circuit 216. Driver circuit 216 supplies read voltage through array 210 during the read mode and programming current during the program mode. The opposite ends (left-hand ends) of digitlines $DL_0$ through $DL_3$ are connected through a bank of transistors 218 to ground during the programming mode and are disconnected during the read mode. Thus, programming current flows through digitlines $DL_0$ through $DL_3$, between driver 216 and ground. During the read mode, read current flows through a selected data magnetoresistive element 213 and an associated reference magnetoresistive element 213, between driver 216 and current conveyors in bank 205.

Thus, a magnetoresistive random access memory architecture free of isolation devices is disclosed in which a reference column of magnetoresistive elements is provided. The reference column magnetoresistive devices connect to a separate digitline, which results in a higher number of digitlines in the architecture and, consequently, a higher number of digitline select circuits. The same read circuitry, including current conveyors and differential amplifiers, can be used as described in the circuit of FIG. 9, except that the reference current conveyor receives a different bias voltage (Vr) than the data reference conveyors (V1). In this manner Vr can be adjusted such that the output signal $V_{0ref}$ is at a midpoint between Vmax and Vmin, where Vmax and Vmin are data maximum and minimum current conveyor outputs, respectively.

The data current conveyors in bank 205 see identical impedances looking into the bitlines so that they all apply equal clamping voltages to the data bitlines and equal clamping voltages minimize leakage between data bitlines so that isolation devices are not necessary. Obviously, different clamp voltages result in impedance differences between the data bitlines and the reference bitlines, but they are isolated from each other by the different digitlines and, as a result, there is no leakage between them. It will be understood that there can be any number of reference lines, depending upon the number of reference columns used.

Here again it should be specifically noted that current conveyors in current conveyor bank 205 are connected directly to the ends of bitlines $BL_0$ through $BL_3$ and $BL_{ref}$ and the column select transistors in column select transistor circuit 206 connect the outputs of the current conveyors to differential amplifier 220. This specific arrangement allows all of the data current conveyors to be clamped to the same voltage which reduces or removes sneak circuits between data current conveyors to substantially reduce leakage currents.

Turning now to FIG. 12, a simplified schematic diagram is illustrated of another complete memory architecture 300 incorporating a magnetoresistive memory array 310 free of isolation devices in accordance with the present invention. In this example, array 310 includes a regular array of magnetoresistive elements 313 connected in first data columns 314 with non-volatile magnetoresistive elements each programmable to one of an Rmax and an Rmin state and alternate second data columns 315 each oppositely programmable to one of an Rmin and an Rmax state. The non-volatile magnetoresistive elements 313 in first data columns 314 are each directly connected, without incorporating isolation devices, at one end to one of the column bitlines $BL_0$ through $BL_3$ and at the other end to one digitline of a plurality of digit lines $DL_0$ through $DL_3$. The non-volatile magnetoresistive elements 313 in second data columns 315 are each directly connected, without incorporating isolation devices, at one end to one of the column bitlines $BL_{0p}$ through $BL_{3p}$ and at the other end to one digitline of a plurality of digit lines $DL_0$ through $DL_3$.

The upper ends of bitlines $BL_0$ through $BL_3$ are connected through a column mode-select transistor circuit 302 to a first bi-directional current source/sink 303. The upper ends of bitlines $BL_{0p}$ through $BL_{3p}$ are connected through column mode-select transistor circuit 302 to a second bi-directional current source/sink 304. Bi-directional current source/sinks 303 and 304 are activated to cause opposite data to be stored in columns 314 and 315. All of the transistors in circuit 302 are connected to be activated by a read or program (WE) signal. In this embodiment, when WE is a logic zero the circuit is in the program mode of operation and when WE is a logic one the circuit is in the read mode of operation.

The opposite ends of bitlines $BL_0$ through $BL_3$ and $BL_{0p}$ through $BL_{3p}$ are connected through a bank of current conveyors 305 to a column select transistor circuit 306. Circuit 306 connects a selected current conveyor in bank 305 and its associated data bitline $BL_0$ through $BL_3$ to one input of a differential amplifier 320 and an adjacent current conveyor in bank 305 and its associated data bitline $BL_{0p}$ through $BL_{3p}$ to the other input of differential amplifier 320. Thus, a voltage generated in a selected current conveyor in bank 305 (by a selected magnetoresistive element 313 connected to a bitline $BL_0$ through $BL_3$) is compared to the voltage generated in an adjacent or associated current conveyor in bank 305 (by a selected magnetoresistive element 313 connected to a bitline $BL_{0p}$ through $BL_{3p}$). Current conveyors connected to two adjacent bitlines have the same bias/clamp voltage ($V_1$) and, as a result, all data lines get clamped to the same voltage.

Here again it should be specifically noted that current conveyors in current conveyor bank 305 are connected directly to the ends of bitlines $BL_0$ through $BL_3$ and $BL_{0p}$ through $BL_{3p}$ and the column select transistors in column select transistor circuit 306 connect the outputs of the current conveyors to differential amplifier 320. This specific arrangement allows all of the data current conveyors associated with bitlines $BL_0$ through $BL_3$ to be clamped to the same voltage and all of the data current conveyors associated with bitlines $BL_{0p}$ through $BL_{3p}$ to be clamped to the same voltage, which reduces or removes sneak circuits between data current conveyors to substantially reduce leakage currents.

A bank of pairs of program select transistors 312 are connected between bitlines $BL_0$ through $BL_3$ and $BL_{0p}$ through $BL_{3p}$, respectively, and a bi-directional current source/sink 313 and 314. The transistors in bank 312 connect each bitline $BL_0$ through $BL_3$ and its adjacent or associated bitline $BL_{0p}$ through $BL_{3p}$ to a pair of bi-directional current source/sinks 313 and 314. During the programming mode, a pair of bitlines are selected by simultaneously activating a pair of the transistors in bank 312. A control or multiplexing circuit, similar to that illustrated in FIG. 10, is included to provide the column select signals.

As depicted in FIG. 12, the right-hand end of digitlines $DL_0$ through $DL_3$ are connected through a digitline select circuit 317 to a driver circuit 316. Driver circuit 316 supplies read voltage through array 310 during the read mode and programming current during the program mode. The opposite ends (left-hand ends) of digitlines $DL_0$ through $DL_3$ are connected through a bank of transistors 318 to ground during the programming mode and are disconnected during the read mode. Thus, programming current flows through digitlines $DL_0$ through $DL_3$, between driver 316 and ground. During the read mode, read current flows through a selected pair of data magnetoresistive element 313, between driver 316 and current conveyors in bank 305.

Because the output signal from differential amplifier 320 is generated from a pair of opposite state data signals (two Magnetoresistive elements in opposite states), the resulting output signal is double the output signal generated from a single magnetoresistive element. Thus, the present embodiment has a faster read access at the expense of an array of magnetoresistive elements with double the size, although it can still generally be fabricated smaller than an array requiring isolation devices.

Thus, several embodiments of magnetoresistive random access memory architecture free of isolation devices are disclosed. In embodiments utilizing midpoint generators in the reference columns, the reference columns are generally made up of n/2 midpoint generator cells, where n is the number of memory cells in each data column. Also, the midpoint generator placement in each reference column is such that each midpoint generator occupies the area taken by four magnetoresistive elements.

In all of the various embodiments, generally a memory is fabricated on a single substrate (e.g. a semiconductor chip or the like) and the magnetoresistive elements are positioned in rows and columns in a regular pattern. Further, the magnetoresistive elements of the plurality of data columns and the magnetoresistive elements of the plurality of reference or associated columns are generally similar. A very important aspect of the reference columns in the various embodiments, including reference columns with midpoint generators, is that they are capacitively very close to the adjacent data columns. As a result, all time varying signals in the data and reference columns track very closely, resulting in high speed read processing. Thus, new and improved MRAM architectures without isolation devices are disclosed and described which greatly improve the fabrication and size of random access memory architecture.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. Magnetoresistive random access memory architecture free of isolation devices comprising:
   a plurality of data columns, each including an associated column bitline, and a plurality of spaced apart digitlines;
   the plurality of data columns each including a first plurality of non-volatile magnetoresistive elements each programmable to one of an Rmax and an Rmin state connected to have information stored therein, the first plurality of non-volatile magnetoresistive elements in each of the data columns each being connected at one end to the associated column bitline and at another end, one each, to a digitline of the plurality of digit lines;
   a reference column including a second plurality of non-volatile magnetoresistive elements positioned adjacent to the data column, the reference column having an associated reference bitline coupled to the second plurality of non-volatile magnetoresistive elements;
   a plurality of data current conveyor circuits, one each coupled to each of the associated column bitlines, each data current conveyor circuit having an output terminal;
   a reference current conveyor circuit coupled to the reference bitline and having an output terminal;
   a differential amplifier having first and second inputs; and
   selection circuitry coupling the output terminal of a selected one of the plurality of data current conveyor circuits to the first input of the differential amplifier and the output terminal of the reference current conveyor circuit to the second input of the differential amplifier for differentially comparing a data voltage generated from the selected one of the plurality of data current conveyor circuits to a reference voltage generated from the reference current conveyor circuit and providing a data output signal.

2. Magnetoresistive random access memory architecture free of isolation devices as claimed in claim 1 wherein each non-volatile magnetoresistive element of the data column includes a magnetic tunnel junction.

3. Magnetoresistive random access memory architecture free of isolation devices as claimed in claim 1 wherein the reference column includes a midpoint generator positioned adjacent the data column, the midpoint generator including a plurality of non-volatile magnetoresistive elements each having an Rmax state and an Rmin state and each being set to one of Rmax and Rmin and the plurality of non-volatile magnetoresistive elements being connected together to provide a total resistance of a midpoint resistance between Rmax and Rmin.

4. Magnetoresistive random access memory architecture free of isolation devices as claimed in claim 1 further including a second plurality of spaced apart digitlines, each of the non-volatile magnetoresistive elements in the second plurality of non-volatile magnetoresistive elements being connected at one end to the associated reference bitline and at another end, one each, to a digitline of the second plurality of digitlines.

5. Magnetoresistive random access memory architecture free of isolation devices as claimed in claim 1 further including a plurality of reference columns each including an associated reference bitline and a second plurality of non-volatile magnetoresistive elements connected thereto, each reference column of the plurality of reference columns forming an opposing pair with an associated data column of the plurality of data columns, and the selection circuitry coupling selected opposing pairs to the differential amplifier.

6. Magnetoresistive random access memory architecture free of isolation devices as claimed in claim 1 wherein the plurality of data columns and the reference column are clamped to a common voltage.

7. Magnetoresistive random access memory architecture free of isolation devices comprising:
   a column bitline defining a data column and a plurality of spaced apart digitlines;
   the data column including a plurality of non-volatile magnetoresistive elements each programmable to one of an Rmax and an Rmin state connected to have information stored therein, the non-volatile magnetoresistive elements in the data column each being connected at one end to the column bitline and at another end, one each, to a digitline of the plurality of digit lines;
   a reference column including a midpoint generator positioned adjacent the data column, the midpoint generator including a plurality of non-volatile magnetoresistive elements each having an Rmax state and an Rmin state and each being set to one of Rmax and Rmin and the plurality of non-volatile magnetoresistive elements being connected together to provide a total resistance of a midpoint resistance between Rmax and Rmin; and
   a data current conveyor circuit coupled to the associated column bitline and having an output terminal;
   a reference current conveyor circuit coupled to the reference bitline and having an output terminal;
   a differential amplifier having first and second inputs; and
   selection circuitry coupling the output terminal of the data current conveyor circuit to the first input of the differential amplifier and the output terminal of the reference current conveyor circuit to the second input of the differential amplifier for differentially comparing a data voltage generated from the data current conveyor circuit to a reference voltage generated from the reference current conveyor circuit and providing a data output signal.

8. Magnetoresistive random access memory architecture free of isolation devices as claimed in claim 7 wherein each non-volatile magnetoresistive element of the data column includes a magnetic tunnel junction.

9. Magnetoresistive random access memory architecture free of isolation devices as claimed in claim 7 wherein the data column includes a plurality of pairs of non-volatile magnetoresistive elements and the reference column includes a midpoint generator operatively and physically associated with each pair of non-volatile magnetoresistive elements.

10. Magnetoresistive random access memory architecture free of isolation devices as claimed in claim 7 further including a plurality of data columns of non-volatile magnetoresistive elements positioned adjacent the reference column, each of the plurality of data columns having a data current conveyor circuit coupled to an associated column bitline.

11. Magnetoresistive random access memory architecture free of isolation devices as claimed in claim 7 wherein the midpoint generator included in the reference column further includes an input terminal and an output terminal, a first series circuit including a first magnetoresistive element with a resistance equal to Rmax connected in series with a first magnetoresistive element with a resistance equal to Rmin, the first series circuit connected in series between the input terminal and the output terminal, and a second series circuit including a second magnetoresistive element with a resistance equal to Rmax connected in series with a second magnetoresistive element with a resistance equal to Rmin, the second series circuit connected in series between the input terminal and the output terminal and in parallel with the first series circuit, whereby a total resistance between the input terminal and the output terminal is a midpoint between Rmax and Rmin.

12. Magnetoresistive random access memory architecture free of isolation devices comprising:

a plurality of data columns, each including an associated column bitline, and a first plurality of spaced apart digitlines;

the plurality of data columns each including a first plurality of non-volatile magnetoresistive elements each programmable to one of an Rmax and an Rmin state connected to have information stored therein, the first plurality of non-volatile magnetoresistive elements in each of the data columns each being connected at one end to the associated column bitline and at another end, one each, to a digitline of the first plurality of digit lines;

a reference column including a second plurality of non-volatile magnetoresistive elements positioned adjacent to the plurality of data columns, the reference column having an associated reference bitline and a second plurality of spaced apart digitlines, the second plurality of non-volatile magnetoresistive elements in the reference column each being connected at one end to the associated reference bitline and at another end, one each, to a digitline of the second plurality of digit lines, the second plurality of spaced apart digitlines being electrically separated form the first plurality of spaced apart digitlines;

a plurality of data current conveyor circuits, one each coupled to each of the associated column bitlines, each data current conveyor circuit having an output terminal;

a reference current conveyor circuit coupled to the associated reference bitline and having an output terminal;

a differential amplifier having first and second inputs; and selection circuitry coupling the output terminal of a selected one of the plurality of data current conveyor circuits to the first input of the differential amplifier and the output terminal of the reference current conveyor circuit to the second input of the differential amplifier for differentially comparing a data voltage generated from the selected one of the plurality of data current conveyor circuits to a reference voltage generated from the reference current conveyor circuit and providing a data output signal.

13. Magnetoresistive random access memory architecture free of isolation devices as claimed in claim 12 wherein each non-volatile magnetoresistive element of the data column includes a magnetic tunnel junction.

14. Magnetoresistive random access memory architecture free of isolation devices as claimed in claim 12 wherein the reference current conveyor circuit includes a bias voltage terminal designed to adjust a voltage at the output terminal approximately midway between a maximum and a minimum signal on the output terminals of the plurality of data current conveyor circuits.

15. Magnetoresistive random access memory architecture free of isolation devices comprising:

a plurality of spaced apart digitlines;

a plurality of data columns, each including an associated data bitline, the plurality of data columns each including a first plurality of non-volatile magnetoresistive elements each programmable to one of an Rmax and an Rmin state connected to have information stored therein, the first plurality of non-volatile magnetoresistive elements in each of the data columns each being connected at one end to the associated data bitline and at another end, one each, to a digitline of the plurality of digit lines;

a plurality of reference columns each including an associated reference bitline and a second plurality of non-volatile magnetoresistive elements connected thereto, each reference column of the plurality of reference columns forming an opposing pair with an associated data column of the plurality of data columns, the associated reference bitlines being electrically separated form the associated data bitlines;

a plurality of data current conveyor circuits, one each coupled to each of the associated data bitlines, each data current conveyor circuit having an output terminal;

a plurality of reference current conveyor circuits, one each coupled to each of the associated reference bitlines, each reference current conveyor circuit having an output terminal;

a differential amplifier having first and second inputs; and selection circuitry for selecting an opposing pair including a selected data current conveyor circuit and a selected reference current conveyor circuit, the selection circuitry coupling the output terminal of the selected data current conveyor circuit to the first input of the differential amplifier and the output terminal of the selected reference current conveyor circuit to the second input of the differential amplifier for differentially comparing a data voltage generated by the selected data current conveyor circuit to a reference voltage generated by the selected reference current conveyor circuit and providing a data output signal.

16. Magnetoresistive random access memory architecture free of isolation devices as claimed in claim 15 wherein the second plurality of non-volatile magnetoresistive elements in each of the plurality of reference columns are programmable to one of an Rmin and an Rmax state, and programming circuitry for programming opposing pairs so that the non-volatile magnetoresistive element of the second plurality of non-volatile magnetoresistive elements in the opposing pair is programmed into an opposite state to a state programmed into the non-volatile magnetoresistive element of the first plurality of non-volatile magnetoresistive elements in the opposing pair.

17. Magnetoresistive random access memory architecture free of isolation devices as claimed in claim 15 wherein each non-volatile magnetoresistive element of the data column includes a magnetic tunnel junction.

* * * * *

UNITED STATES PATENT AND TRADEMARK OFFICE
CERTIFICATE OF CORRECTION

PATENT NO.    : 6,512,689 B1
DATED         : January 28, 2003
INVENTOR(S)   : Naji et al.

It is certified that error appears in the above-identified patent and that said Letters Patent is hereby corrected as shown below:

Column 1,
Line 2, please add as a new first paragraph the followng paragraph:
-- The invention was made with Government support under Agreement No. MDA972-96-3-0016 awarded by DARPA. The Government has certain rights in the invention. --

Signed and Sealed this

Sixteenth Day of September, 2003

JAMES E. ROGAN
*Director of the United States Patent and Trademark Office*